United States Patent
Sugawa et al.

(10) Patent No.: US 12,159,892 B2
(45) Date of Patent: Dec. 3, 2024

(54) OPTICAL SENSOR AND SIGNAL READOUT METHOD THEREOF, OPTICAL AREA SENSOR AND SIGNAL READOUT METHOD THEREOF

(71) Applicant: TOHOKU UNIVERSITY, Miyagi (JP)

(72) Inventors: Shigetoshi Sugawa, Miyagi (JP); Rihito Kuroda, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 768 days.

(21) Appl. No.: 17/267,980

(22) PCT Filed: Aug. 23, 2018

(86) PCT No.: PCT/JP2018/031073
§ 371 (c)(1),
(2) Date: Feb. 11, 2021

(87) PCT Pub. No.: WO2020/039531
PCT Pub. Date: Feb. 27, 2020

(65) Prior Publication Data
US 2021/0217801 A1    Jul. 15, 2021

(51) Int. Cl.
*H01L 27/146* (2006.01)
*H04N 25/53* (2023.01)
*H04N 25/76* (2023.01)

(52) U.S. Cl.
CPC ....... *H01L 27/14643* (2013.01); *H04N 25/53* (2023.01); *H04N 25/76* (2023.01)

(58) Field of Classification Search
CPC .......................... H01L 27/14643; H04N 25/76
See application file for complete search history.

(56) References Cited

U.S. PATENT DOCUMENTS 6,388,243 B1 * 5/2002 Berezin ............. H01L 27/14609
                                                    257/292
2005/0092895 A1   5/2005 Fossum
(Continued)

FOREIGN PATENT DOCUMENTS

JP        4-127583      4/1992
JP      2005-354568    12/2005
(Continued)

OTHER PUBLICATIONS

International Search Report issued in International Patent Application No. PCT/JP2018/031073, dated Nov. 27, 2018.
(Continued)

*Primary Examiner* — Thanh Luu
(74) *Attorney, Agent, or Firm* — GREENBLUM & BERNSTEIN, P.L.C.

(57) ABSTRACT

[Problem] To provide an optical sensor which can read out faster and requires lower power consumption than conventional optical sensors while maintaining advantages and superiorities of conventional optical sensors in which a transfer switch is provided between a light receiving element (PD) and a floating diffusion (CFD). [Solution] A semiconductor junction of a light-receiving element is fully depleted and a potential curve of electrons has a negative slope toward the floating diffusion and connected to an uppermost position of an electronic potential well of the floating g diffusion keeping its negative slope state.

6 Claims, 8 Drawing Sheets

(56) References Cited

U.S. PATENT DOCUMENTS

| | | |
|---|---|---|
| 2006/0261251 A1 | 11/2006 | Fossum |
| 2008/0094483 A1 | 4/2008 | Fossum |
| 2009/0251580 A1* | 10/2009 | Schemmann .......... H04N 25/63 |
| | | 348/308 |
| 2010/0164033 A1 | 7/2010 | Lee |
| 2010/0182470 A1 | 7/2010 | Sugawa et al. |
| 2010/0187401 A1 | 7/2010 | Kawahito |
| 2010/0276572 A1 | 11/2010 | Iwabuchi et al. |
| 2014/0054583 A1 | 2/2014 | Uemura et al. |
| 2014/0063304 A1 | 3/2014 | Manabe et al. |
| 2014/0085512 A1* | 3/2014 | Ikeda et al. |
| 2015/0229859 A1* | 8/2015 | Guidash ................ H04N 25/76 |
| | | 348/308 |
| 2017/0195602 A1 | 7/2017 | Iwabuchi et al. |
| 2017/0324916 A1 | 11/2017 | Sugawa et al. |
| 2018/0054583 A1 | 2/2018 | Iwabuchi et al. |
| 2018/0234652 A1 | 8/2018 | Sugawa et al. |

FOREIGN PATENT DOCUMENTS

| | | |
|---|---|---|
| JP | 2007-178314 | 7/2007 |
| JP | 2012-253422 | 12/2012 |
| TW | 201025587 | 7/2010 |
| WO | 2006/129762 | 12/2006 |
| WO | 2007/083704 | 7/2007 |
| WO | 2016/080337 | 5/2016 |

OTHER PUBLICATIONS

Written Opinion of the International Searching Authority issued in International Patent Application No. PCT/JP2018/031073, dated Nov. 27, 2018.

Official Action dated May 3, 2022 issued in Taiwanese patent application No. 107132194 along with partial English machine translation.

Japanese Office Action dated Jan. 17, 2023 issued in Japanese patent application No. 2020-537947, along with an English translation.

* cited by examiner

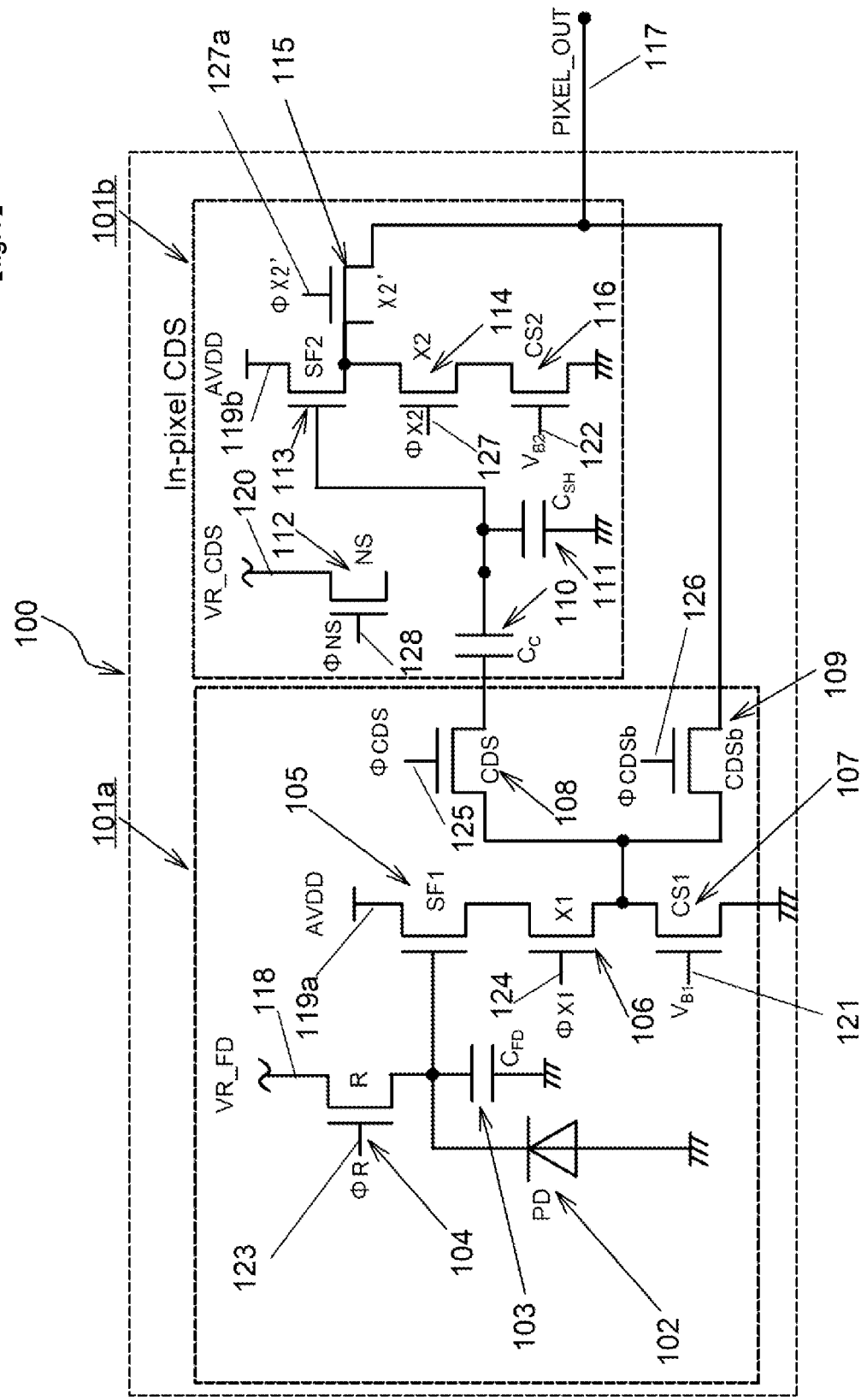
[fig.1]

[fig.2A]
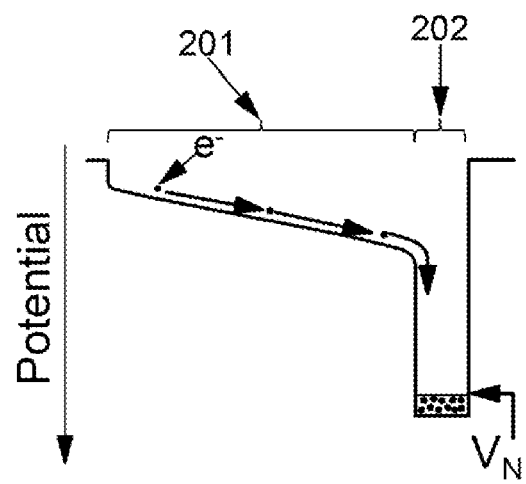
[fig.2B]
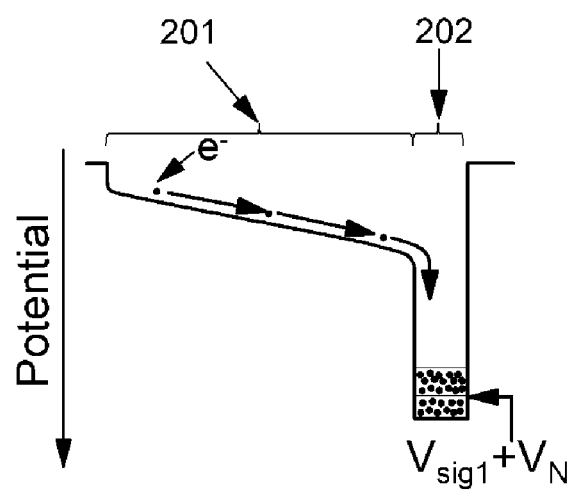

[fig.2C]
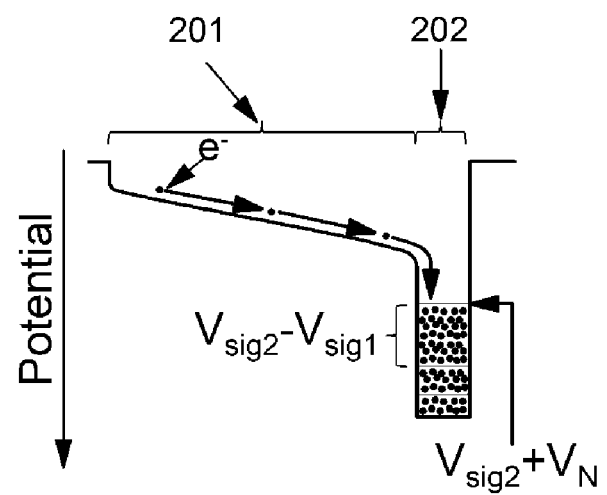

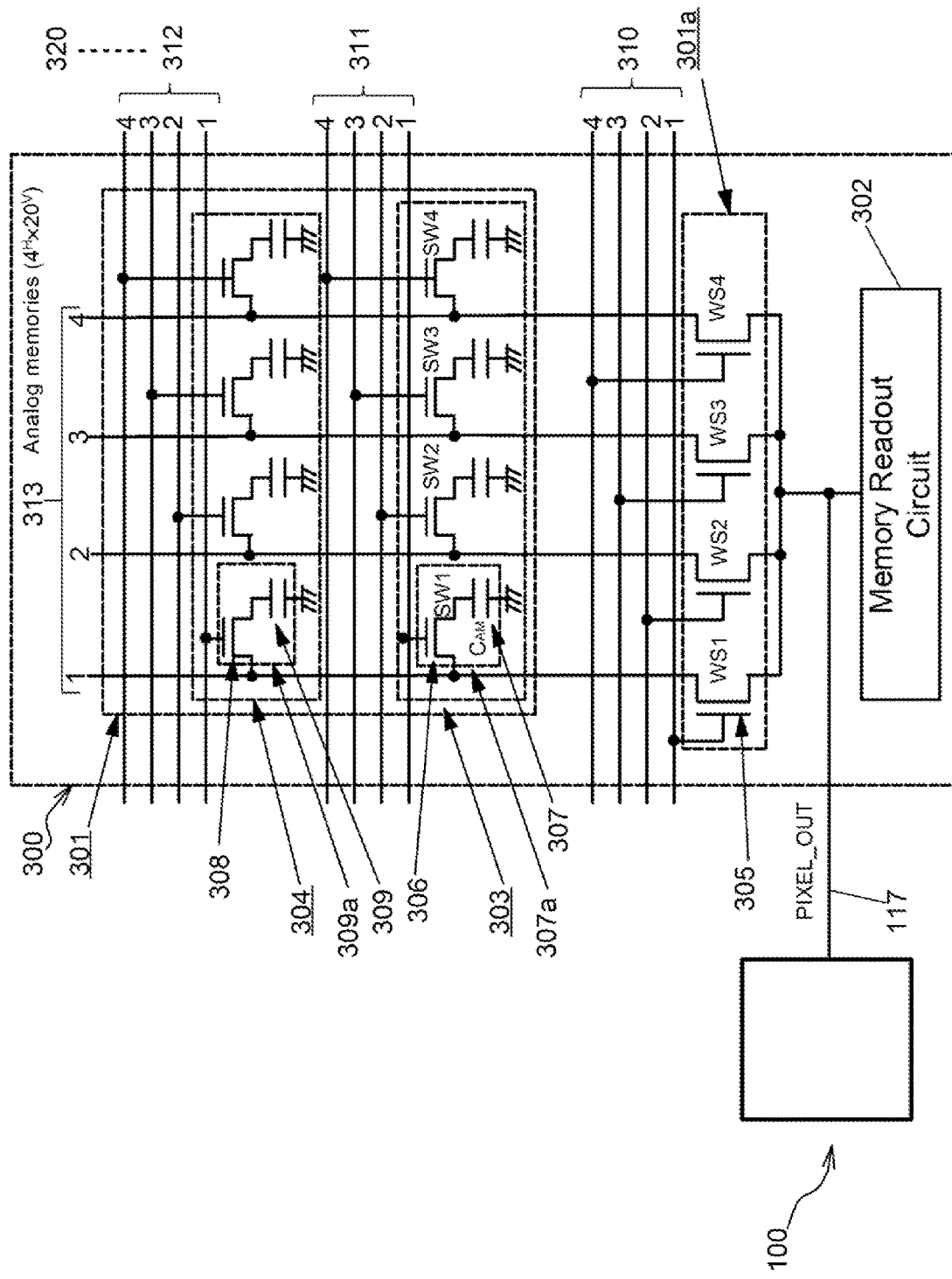

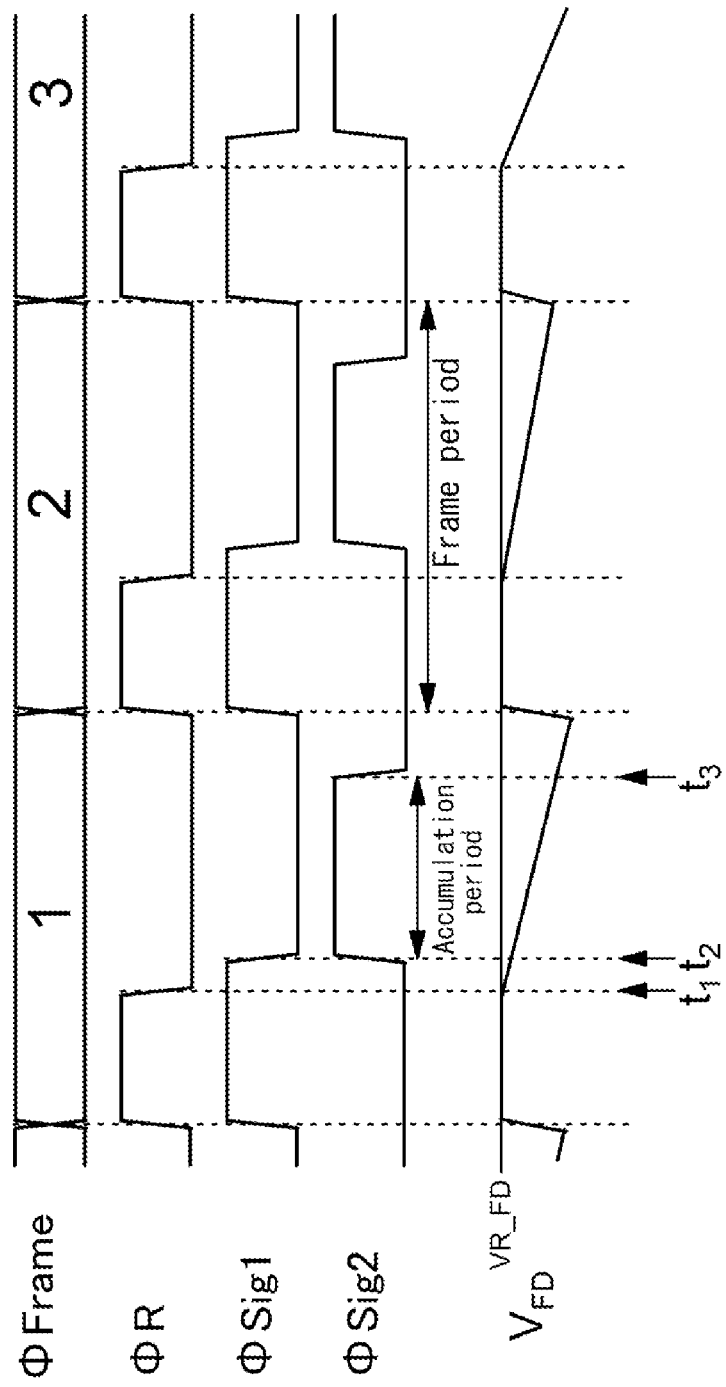

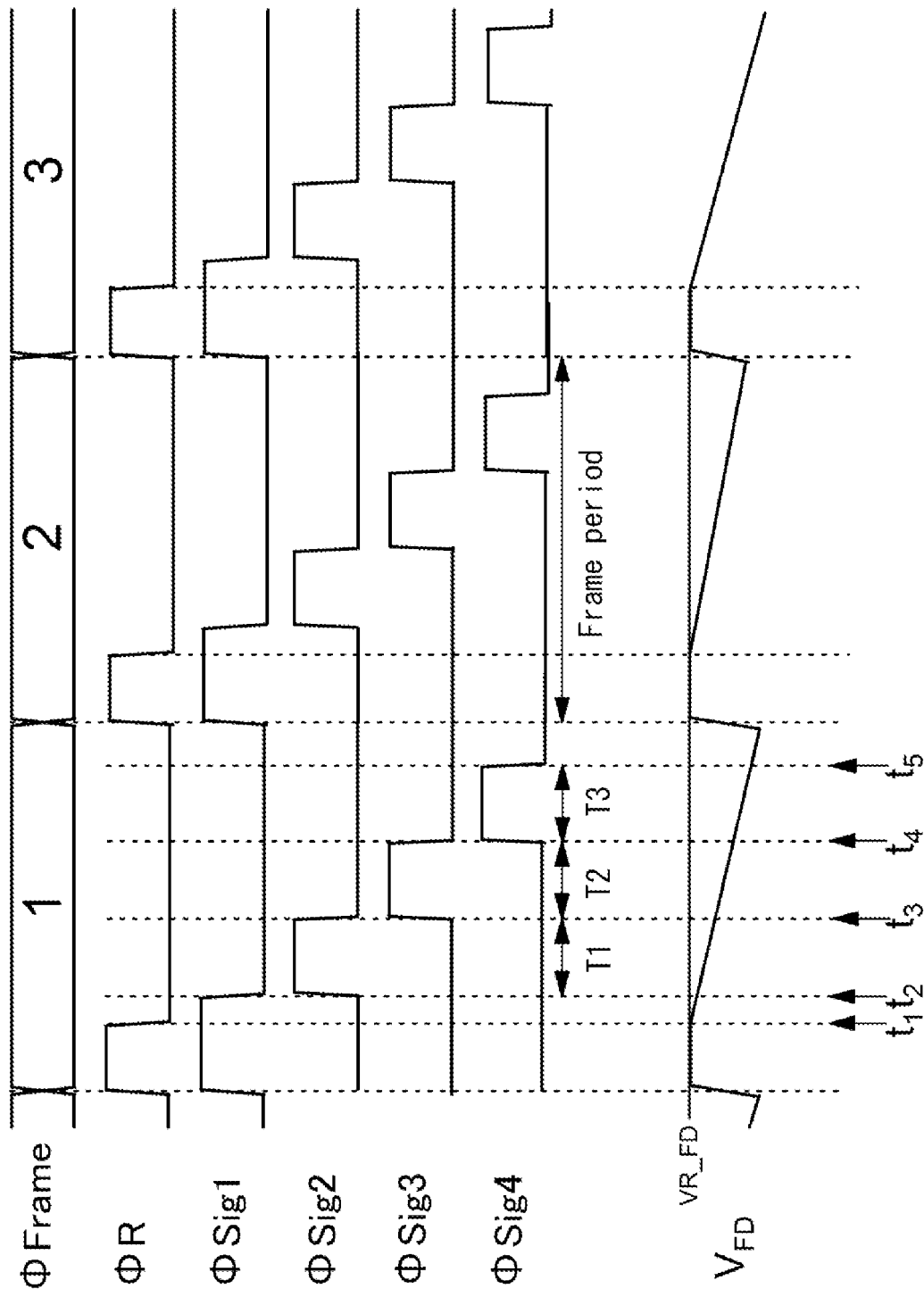

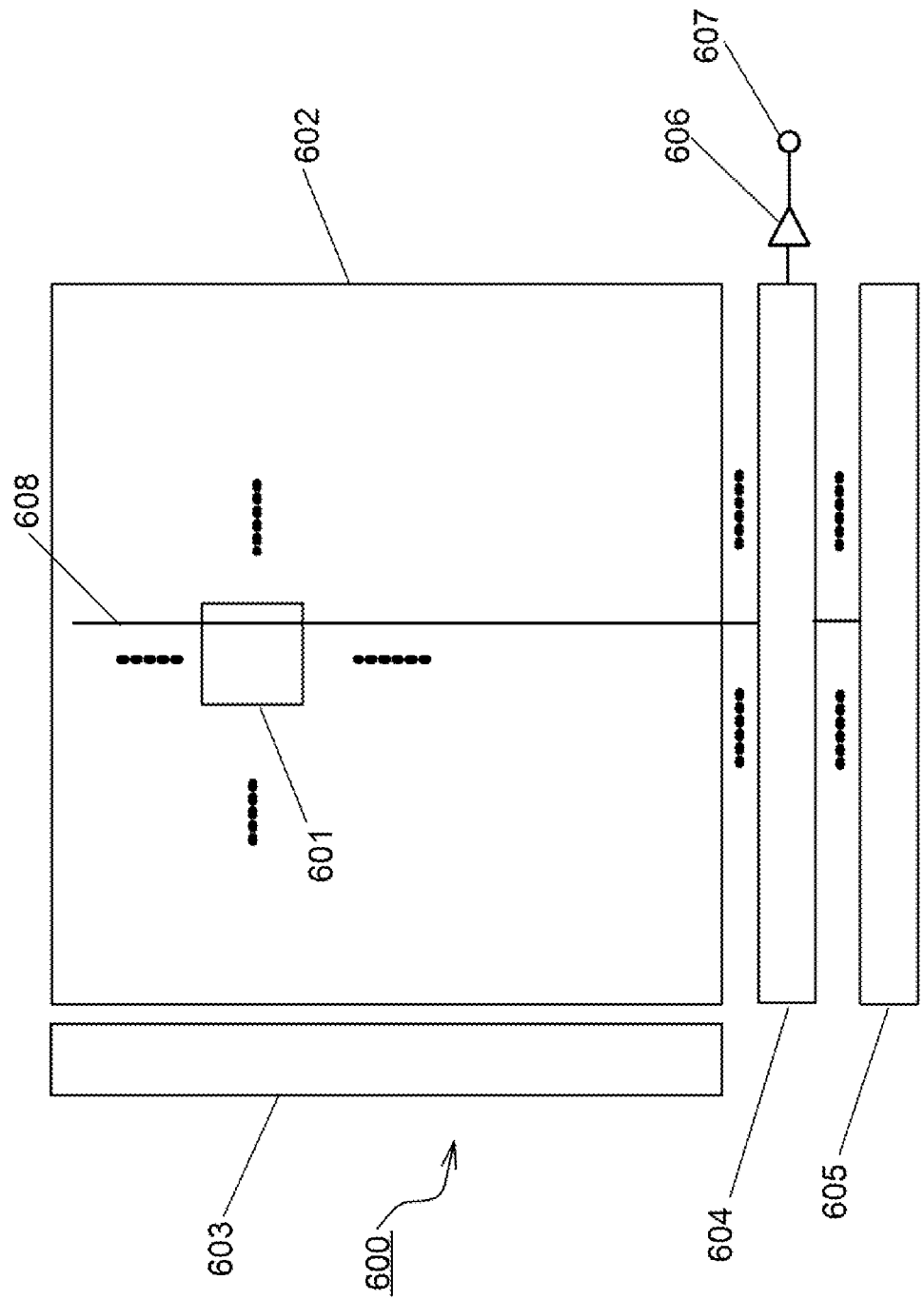

[fig.7]
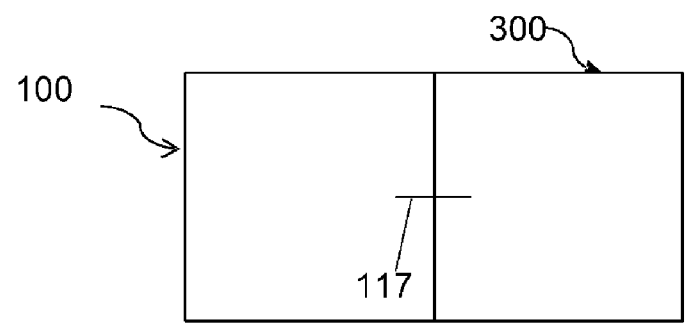
[fig.8]
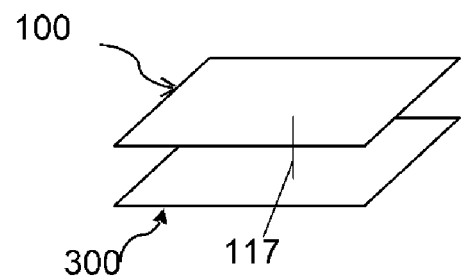

OPTICAL SENSOR AND SIGNAL READOUT METHOD THEREOF, OPTICAL AREA SENSOR AND SIGNAL READOUT METHOD THEREOF

TECHNICAL FIELD

The present invention relates particularly to an optical sensor and a signal readout method thereof and an optical area sensor and a signal readout thereof capable of reading out a clear image to be applied to an apparatus for optical measurement and analysis etc. at a high speed of 1 million frames per second or more.

BACKGROUND ART

Along with advancement of science and technology and penetration of the Internet society, demand for line-shaped or area-shaped optical sensors, solid-state imaging devices, and the like (hereinafter, individually or collectively referred to as "optical sensors") has increased dramatically. Among them, optical sensors for high sensitivity, high speed, wide dynamic range, and wide optical wavelength band, and solid-state imaging devices for still images and moving images, which are especially applied to devices such as optical measurement and analysis, are strongly required in the market as indispensable items for new market development. In particular, optical sensors and solid-state imaging devices with a wider dynamic range are in great demand in the medical, pharmaceutical, health, and nursing care markets, the life sciences market, the disaster prevention and crime prevention markets that are essential for creating a safe and secure society, and 4K, 8K broadcasting age.

As an example of a high sensitivity, high speed, wide dynamic range, wide optical wavelength band compatible optical sensor and solid-state imaging device, is described, for example, in Patent Literature 1.

PATENT LITERATURE

PTL 1: International publication No. WO2016080337

SUMMARY OF INVENTION

Technical Problem

The optical sensor and the solid-state imaging device (hereinafter, either or both of the optical sensor and the solid-state imaging device may be referred to as "optical sensor") described in Patent Literature 1 are certainly superior to the previous ones in terms of high sensitivity, high speed, wide dynamic range, and wide optical wavelength band correspondence, but in order to respond to the above-mentioned markets and times, further high-speed correspondence is required while taking advantage of the above benefits. However, in the above optical sensor, a transfer switch is provided between a photodiode which is one of the light-receiving element (hereinafter, it may be abbreviated as "PD") and a floating diffusion (hereinafter, it may be abbreviated as "CFD"). By turning the transfer switch on and off, the electric charge in the photodiode (PD) is transferred to the floating diffusion (CFD).

Therefore, the settling period of the pixel driving pulse for turning the transfer switch on and off is required, and because it takes a time, speed-up of the frame rate is restricted. Further, it was necessary to propagate a plurality of pixel driving pulses to the entire pixel region at high speed, which increased the power consumption.

Incidentally, a pixel referred to as "pixel" in the present case means a pixel composed of a light-receiving element (PD) and a floating diffusion (CFD) unless otherwise specified.

The present invention has been made in view of the above, its main object is to provide an optical sensor that can read out at a higher speed than conventional ones and can further reduce power consumption while maintaining the merits and advantages of the conventional optical sensor in which a transfer switch is provided between a light receiving element (PD) such as a photodiode and a floating diffusion (CFD).

Solution to Problem

The present invention has been made intensive research and development in view of the above. One of the features lies in a signal readout method of the optical sensor and an optical sensor used in the signal readout method, the signal readout method comprising performing light-receiving by a light-receiving element which has semiconductor junction completely depleted and a potential curve of electrons having a negative slope toward a floating diffusion and connected to an uppermost position of an electronic potential well of the floating diffusion while keeping its negative slope state; and performing at least twice during each frame period provided in a period of the light-receiving, a step of transferring electrons produced in the light-receiving element in response to the light-receiving to the potential well according to the potential curve, and accumulating the electrons in the potential well.

Another feature of the present invention lies in an optical sensor and its signal readout method, the optical sensor comprising:
a light-receiving element;
a floating diffusion that is electrically directly connected to the light-receiving element and accumulates electric charges generated by light input to the light-receiving element; and
a pixel signal output line,
wherein a signal readout path is connected to the pixel signal output line;
a capacitance of the light receiving element (CPD) and a capacitance of the floating diffusion (CFD) have the following relationship:

$$0.0008 \leq (C_{PD})/(C_{FD}) \leq 0.8 \quad (1)$$

$$4.0 \times 10^{-18}\,F \leq (C_{PD}) \leq 4.0 \times 10^{-16}\,F \quad (2)$$

$$5.0 \times 10^{-16}\,F \leq (C_{FD}) \leq 5.0 \times 10^{-15}\,F \quad (3); \text{ and}$$

the light receiving element has a semiconductor junction that is fully depleted and a potential curve of electrons that has a negative slope toward the floating diffusion and is connected to an uppermost position of the electronic potential well of the floating diffusion while keeping its negative slope state.

Still another feature of the present invention lies in an optical area sensor and its signal readout method,
the optical area sensor comprising:
An optical sensor pixel circuit unit including:
an optical sensor pixel circuit which has two output systems alternatively used on a time axis, a light-receiving element and a floating diffusion that is electrically directly connected to the light receiving element and accumulates electric charges generated by light input to the light receiving element, the light receiving element having a semiconductor junction that is completely depleted and a potential curve of electrons that has a negative slope toward the floating diffusion and connected to an uppermost position of an electronic potential well of the floating diffusion while keeping its negative slope state; and an intra-pixel correlated double sampling circuit which outputs a signal (ab1) produced by noise cancellation based on a first output (a1) and a second output (b1) based on an amount of light-electric charges generated in the light receiving-element by light irradiation, which is output from one of the output systems; and An analog memory circuit unit including;

an analog memory array in which a plurality of memory cells holding one of the signal (ab1), the first output (a2) and the second output (b2) output from the other output system are arranged in rows and columns;

a memory cell row selection switch array for selecting any of the rows of the memory cells; and a memory readout circuit for reading out a signal held in any of the memory cells.

Advantageous Effects of Invention

According to the present invention, it is possible to provide an optical sensor and a signal readout method using the optical sensor that can read out at a higher speed than the conventional one and can further reduce power consumption while maintaining the merits and advantages of conventional optical sensors.

Other features and advantages of the present invention will become apparent from the following description taken in conjunction with the accompanying drawings. In the accompanying drawings, the same or similar components are denoted by the same reference numerals.

BRIEF DESCRIPTION OF DRAWINGS

The accompanying drawings are included in the specification, constitute a part thereof, illustrate embodiments of the present invention, and are used together with the description to describe the principles of the present invention.

FIG. 1 is a circuit diagram of a pixel circuit unit for explaining one typical example of a preferred embodiment of the optical sensor of the present invention.

FIG. 2A is a potential explanatory diagram for explaining the principles of pixel driving of a photo sensor, which is a preferred embodiment of the present invention, when a reset is completed (t1).

FIG. 2B is a potential explanatory view for explaining the principles of pixel driving of a photo sensor, which is a preferred embodiment of the present invention, when a first voltage signal is read out (t2).

FIG. 2C is a potential explanatory view for explaining the principles of pixel driving of a photo sensor, which is a preferred embodiment of the present invention, when a second voltage signal is read out (t3).

FIG. 3 is a circuit explanatory diagram of an analog memory circuit unit of an optical sensor according to the present invention.

FIG. 4 is a timing chart showing an example of a time transition of the timing and floating diffusion voltage (VFD) of the pixel drive of the optical sensor according to the present invention.

FIG. 5 is a timing chart showing another example of the timing and floating diffusion voltage (VFD) time transition of the pixel drive of an optical sensor of the present invention.

FIG. 6 is a block diagram for explaining a configuration of an image sensor of the present invention.

FIG. 7 is a layout diagram showing an example of the arrangement of an optical sensor pixel circuit unit 100, an analog memory circuit unit 300 and a pixel output signal line (PIXEL_OUT) 117 constituting a light receiving signal generating and holding element according to the present invention.

FIG. 8 is a layout diagram showing another example of the arrangement of an optical sensor pixel circuit unit 100, an analog memory circuit unit 300 and a pixel output signal line (PIXEL_OUT) 117 constituting a light receiving signal generating and holding element according to the present invention.

DESCRIPTION OF EMBODIMENTS

FIG. 1 is a circuit diagram of a pixel circuit unit for explaining one typical example of a preferred embodiment of the optical sensor of the present invention.

The optical sensor pixel circuit unit 100 shown in FIG. 1 includes an optical sensor pixel circuit 101a and an intra-pixel correlated double sampling circuit (In-pixel CDS) 101b.

The optical sensor pixel circuit 101a includes a light-receiving element (PD) 102, a floating diffusion (CFD) 103, a reset transistor (R) 104, a first source follower transistor (SF1) 105, a first selection transistor (X1) 106, a first current source transistor (CS1) 107, an intra-pixel correlated double sampling selection switch (CDS) 108, and an intra-pixel correlated double sampling bypass switch (CDSb) 109.

FIG. 1 shows a photodiode (PD) as one of preferred examples of the light receiving element (PD) 102, but it may be other phototransistors.

The intra-pixel correlated double sampling circuit 101b includes an intra-pixel correlated double sampling coupling capacitor ($C_c$) 110, an intra-pixel correlated double sampling sample hold capacitance ($C_{SH}$) 111, an intra-pixel correlated double sampling reset transistor (NS) 112, a second source follower transistor (SF2) 113, a second selection transistor (X2) 114, a second selection transistor (X2') 115, and a second current source transistor (CS2) 116.

From the intra-pixel correlated double sampling circuit 101b, a pixel output signal line (PIXEL_OUT) 117 for transferring a signal to the next electrical circuit is wired.

The feature of the optical sensor of the present invention that is progressive, useful and large compared to the prior examples lies in the physical structure of the light-receiving element (PD) 102 and its energy potential with respect to photo-electric charge (electrons).

The internal structure of the light-receiving element (PD) 102 is provided with at least one semiconductor junction formed by joining semiconductor layer regions of the two different types of semiconductor ($P^+$ type, P type, $P^-$ type, I type, $N^+$ type, N type, $N^-$ type).

In the present invention, an energy potential (related to photoelectric charge) that is completely or substantially completely depleted (hereinafter, it may be referred to as "completely depleted type" in any sense) is formed in the semiconductor junction region of the light receiving element (PD) 102.

In the present invention, "completely depleted" means that the potential displacements (or slopes or gradients) in the potential section 201 gradually decrease from the left-hand end to the right-hand end in FIG. 2, as shown in FIGS. 2A to 2C.

In the present invention, "substantially completely depleted" means that the potential displacement is formed in such a shape that photoelectric charge generated in the region of the semiconductor junction of the light-receiving element (PD) 102 by light-receiving can be smoothly transferred to the adjacent floating diffusion (CFD) 103.

These details will be described later.

Further, in the optical sensor of the present invention, the capacitance ($C_{PD}$) of the light-receiving element (PD) 102 and the capacitance ($C_{FD}$) of the floating diffusion (CFD) 103 are preferably set so that the relationship between the capacitance ($C_{PD}$) and the capacitance ($C_{FD}$) satisfies the following formulae.

$$0.0008 \leq (C_{PD})/(C_{FD}) \leq 0.8. \quad (1)$$

$$4.0 \times 10^{-18} F \leq (C_{PD}) \leq 4.0 \times 10^{-16} F \quad (2)$$

$$5.0 \times 10^{-16} F \leq (C_{FD}) \leq 5.0 \times 10^{-15} F \quad (3)$$

Hereinafter, technical meanings of formulae (1) to (3) in the present invention will be described.

In a pixel of the optical sensor of the present invention, the amount of saturation charge is $$\text{"Vsat} \times (C_{FD} + C_{PD})/q\text{"} \quad (a).$$

So, the charge-voltage conversion gain is given by, $$\text{"}q/(C_{FD} + C_{PD})\text{"} \quad (b).$$

Here,

"$C_{PD}$" is the capacitance of fully depleted light-receiving element (PD) 102, "$C_{FD}$" is the capacitance of floating diffusion (CFD) 103, "Vsat" is the saturated signal voltage at floating diffusion (CFD) 103, and "q" is the electric charge of the element.

In the present invention, the semiconductor junction region in the inner structure of the light-receiving element (PD) 102 may be either a lateral type or a vertical type, but a vertical type is more preferably used.

The capacitance "$_CPD$" is proportional to the junction area of the semiconductor junction of the light-receiving element (PD) 102.

"Junction area" is not necessarily the same as the area of the light-receiving element (PD) 102 on the light incident side (the area that actually exposed to light: the light receiving area), and may be larger than the light-receiving area.

Hereinafter, the "area on the light incident side" may be simply referred to as "area".

To increase the sensitivity of the light-receiving element 102 to increase the sensitivity of the optical sensor, by increasing the light-receiving area of the light-receiving element 102, the number of photoelectric charges per pixel (one light-receiving element) in the same irradiation light amount condition is increased to increase the sensitivity, but the maximum transfer distance of the photoelectric charge is increased to make it difficult to increase time resolution (high-speed reading) (hereinafter, "time resolution" may be referred to as "simultaneity").

Here, "maximum transfer distance of photoelectric charge" refers to the maximum transfer distance in the distance that the photoelectric charge generated in the semiconductor junction of the light-receiving element (PD) 102 moves to the floating diffusion (CFD) 103 when the light-receiving element (PD) 102 receives light from the outside.

The time taken to reach the floating diffusion (CFD) 103 differs between a photoelectric charge generated near the floating diffusion (CFD) 103 and a photoelectric charge generated far from the floating diffusion (CFD) 103. It takes more time (arrival time) for photoelectric charges generated far from the floating diffusion (CFD) 103 to reach the floating diffusion (CFD) 103. If the difference in arrival time is large, for example, when the frame rate is increased to attempt fast imaging, among photoelectric charges generated at the same time, photoelectric charges having slower arrival time than the frame rate will be detected as optical signals in the subsequent frame, and the effective time resolution will be inferior to the frame rate.

In the present invention, the physical structure of the light-receiving element (PD) 102 is designed on the assumption that a high light-sensitivity correspondence is ensured so as to minimize the difference in the transfer time of the photoelectric charges generated in the light-receiving element (PD) 102 so as to increases the time resolution to correspond to the high-speed reading.

The light-receiving area of the fully depleted light-receiving element (PD) 102 in the present invention is preferably an area capable of securely receiving a sufficient amount of light and collecting generated photoelectric charges within 10 nsec. Such an area is preferably 5 μm square to 50 μm square.

Therefore, it is preferable that the capacitance ($C_{PD}$) of the light-receiving device (PD) 102 is in the range of from $4.0 \times 10^{-18}$ F corresponding to 5 μm square to $4.0 \times 10^{-16}$ F corresponding to 50 μm square.

In the present invention, since the floating diffusion (CFD) 103 is directly connected to the fully depleted light-receiving element (PD) 102 to form an electric field for drift-transporting the photoelectric charge toward the floating diffusion (CFD) 103, it is preferable to set the capacitance ($C_{FD}$) and capacitance ($C_{PD}$) so that the charge-voltage conversion gain and the number of saturated charges are not easily affected by the light-receiving area and layout of the light-receiving element (PD) 102.

Preferably, capacitance ($C_{FD}$) should be greater than capacitance ($C_{PD}$), more preferably capacitance ($C_{FD}$) is so greater than capacitance ($C_{PD}$) that capacitance ($C_{PD}$) can be ignored, and ($C_{FD}+C_{PD}$) is preferably equal or substantially equal to capacitance ($C_{FD}$).

When the capacitance ($C_{PD}$) becomes so large that it cannot be ignored with respect to the capacitance ($C_{FD}$), even if the light-receiving area of the light-receiving element (PD) 102 slightly changes, the charge-voltage conversion gain inversely proportional to ($C_{FD}+C_{PD}$) and the saturated charge number proportional to ($C_{FD}+C_{PD}$) are affected by the change. In this respect, in the present invention, since the variation may be ignored as long as it is within a range in which the object of the present invention can be achieved, the variation due to the design of the light-receiving element (PD) 102 can be tolerated within a range in which the variation can be ignored.

In the present invention, the higher the charge-voltage conversion gain is, the lower the noises are, however, when the value of the capacitance ($C_{FD}$) is reduced in order to increase the charge-voltage conversion gain, the saturated charge amount is reduced, and therefore, the value of the capacitance ($C_{FD}$) is preferably set within the range of from $5.0 \times 10^{-16}$ F to $5.0 \times 10^{-15}$ F.

When the value of the capacity ($C_{FD}$) is $5.0 \times 10^{-16}$ F or more, if the capacitance ($C_{FD}$) is sufficiently larger than the capacity ($C_{PD}$) and the capacity ($C_{PD}$) can be ignored, the charge-voltage conversion gain is 320 μV/e— or less. In addition, when the capacitance ($C_{FD}$) of the floating diffusion (CFD) 103 is 80 μVrms or less, it is possible to obtain an accuracy capable of counting the number of photoelectric charges even when the number of collected photoelectric charges is small.

On the other hand, when the capacitance ($C_{FD}$) is $5.0 \times 10^{-15}$ F or less and the "Vsat" is 1V or more, the number of saturated charges is 30,000 or more, and even when a pixel is irradiated with a locally strong amount of light, it is possible to suppress white skipping.

($C_{PD}/C_{FD}$) is preferably smaller than 1 because if the capacitance (CFD) is larger than the capacitance (CPD), capacity ($C_{FD}$) can be designed by considering only the charge-voltage conversion gain and the capacitance ($C_{FD}$) without being affected by the area and shape of the photodiodes. In the present invention, preferably, the value of ($C_{PD}/C_{FD}$) is within the range of 0.0008 to 0.8.

When the value of ($C_{PD}/C_{FD}$) is less than 0.0008, the light-receiving area of the light-receiving element (PD) 102 becomes substantially small, and the light sensitivity is too low to achieve the object of the present invention and it may not be appropriate as a high-speed read sensor. When the value of ($C_{PD}/C_{FD}$) exceeds 0.8, the charge voltage conversion gain becomes small and the light sensitivity becomes small, and the object of the present invention cannot be achieved in some cases.

The numbering and naming of electrical terminals to which signals (voltage, electrical pulses, etc.) are applied or provided for use in later description of the operation of the optical sensor shown in FIG. 1 are as follows.

Terminal 118 is for pixel reset voltage (VR_FD),
Terminals 119a and 119b are for power supply voltages (AVDD),
Terminal 120 is for intra-pixel correlated double sampling circuit reset voltage (VR_CDS),
Terminal 121 is for the first current source bias voltage (VB1),
Terminal 122 is for the second current source bias voltage (VB2),
Terminal 123 is for pixel reset pulse (ΦR),
Terminal 124 is for pixel selection first pulse (ΦX1),
Terminal 125 is for intra-pixel correlated double sampling circuit selection pulse (ΦCDS),
Terminal 126 is for intra-pixel correlated double sampling circuit bypass pulse (ΦCDSb),
Terminal 127 is for pixel selection second pulse (ΦX2),
Terminal 127a is for pixel selection second A pulses (ΦX2'),
Terminal 128 is for intra-pixel correlated double sampling reset pulse (ΦNS).

FIGS. 2A to 2C are potential explanatory views for explaining the principles of pixel driving of the optical sensor according to the present invention.

FIG. 2A is a potential diagram at the time of reset completion (t1), FIG. 2B is a potential diagram at the time of first voltage signal reading (t2), and FIG. 2C is a potential diagram at the time of second voltage signal reading (t3).

The timing chart of FIG. 4 shows the timings of the reset completion (t1), the first voltage signal reading (t2), and the second signal reading (t3).

In the FIGS. 2A to 2C, the vertical axis represents the potential for electrons (e−) and the horizontal axis represents the spatial arbitrary axis. Each figure shows potentials with respect to electrons (e−) in a potential section (PD) 201 in a fully depleted photodiode which is one of the light-receiving element (PD) 102 and a potential section (CFD) 202 of the floating diffusion (CFD) 103 adjacent to the section 201.

In the present invention, "fully depleted" means that the potential displacement (or slope or gradient) is progressively decreasing from the left end to the right end of FIG. 2 in potential section 201 as shown in FIGS. 2A to 2C.

In the present invention, it is not limited to the "fully depleted" and may be a "substantially fully depleted" potential displacement.

"Substantially fully depleted" in the present invention means a potential displacement within a range that does not lose the essence of the present invention. For example, the potential displacement at portions near the left end and/or the right end may be flat or the rate of decrease may be slower than the center of the potential displacement, or the potential displacement may be decreased in small steps. In short, if a potential displacement (or potential gradient, field gradient) is formed so that any of the generated photoelectric charges can be drifted or drift-transported (drift-transported to the floating diffusion (CFD) 103) within the range that does not interfere with the intended high-speed reading, the displacement shape of the potential displacement (or slope or gradient) from the left end to the right end can be uniformly reduced, stepwise reduced, or undulated reduced in the present invention.

In the present invention, "fully depleted" means, unless otherwise specified, either or both of the original meaning of "fully depleted" and the meaning of "substantially fully depleted" as exemplified above.

FIG. 3 is a circuit explanatory diagram of an analog memory circuit unit of an optical sensor according to the present invention. Analog memory circuit unit 300 is one of the typical examples of the preferred embodiment.

FIG. 3 shows the optical sensor pixel circuit unit 100 and the analog memory circuit unit 300.

The analog memory circuit unit 300 includes an analog memory array (Analog Memories) 301, a memory cell row selection switch array 301a, and a memory read circuit (Memory Readout) 302.

In the present embodiment, the analog memory array 301 is an array of $4^H \times 20^V$ of memory cells consisting of one memory selection switch (SW) and one memory capacitor ($C_{AM}$). A total of 20 memory cells in each row share one signal line, and the signal lines are selected by row selection switches (WS1 to 4).

Incidentally, in FIG. 3, the analog memory array 301 is described as a ($4^H \times 20^V$) memory array, but actually, only ($4^H \times 2^V$) memory cells are shown and other memory cells are not shown.

The memory cell column selection switch array 301a includes memory column selection switches (WS1~WS4) 305 (1 to 4). Although four switches are shown as memory column selection switches (WS1~WS4) 305 (1-4) in FIG. 3, the present invention is not limited thereto, and the number of columns of the memory array 301 may be increased or decreased according to predetermined designs.

In the pixel signal holding memory array 303 in FIG. 3, four sets of memory cells 307a are shown, and each set is composed of a pixel signal holding memory selection switch (SW) 306 and a pixel signal holding capacitor ($C_{AM}$) 307.

The pixel signal holding memory array 304 in FIG. 3 has the same memory configuration as the pixel signal holding memory array 303. That is, in the analog memory array (Analog Memories) 301, ($4_H \times 20^V$) memory cells 307a are arranged in an array.

Here, the expression of "$4^H \times 20V$" means that 4 memory cells are arranged horizontally (in each row) and 20 memory cells are arranged vertically (in each column).

Originally, two-dimensional matrix analog memory array 301 has 20 rows of pixel signal holding memory arrays arranged, but in FIG. 3, only two pixel signal holding memory arrays (303 and 304) are shown, and the other pixel signal holding memory arrays are not shown.

A total of 20 memory cells in each column share one of the four signal lines 313 (1 to 4) for pixel signal transfer, and each signal line of "1 to 4" is selected by turning on the corresponding memory column selection switch (any of WS1 to WS4) in the four memory cell column selection switches 305 (WS1 to WS4).

Analog memory circuit unit 300 is preferably disposed adjacent to the optical sensor pixel circuit unit 100 in order to shorten the distance of the pixel output signal lines (PIXEL_OUT) 117 to shorten the time required for signal readout, and for example, as shown in FIG. 7, it is disposed adjacent to the optical sensor pixel circuit unit 100 on the same planar. Alternatively, it may be laminated on the optical sensor pixel circuit unit 100 as shown in FIG. 8. In the case of the lamination arrangement shown in FIG. 8, since it is possible to increase the area of the photodiode (PD) 102 relatively, it is suitable for expanding the light receiving area to obtain higher sensitivity.

Next, a signal writing operation of the pixel output signal to the analog memory array 301 will be described.

First, in order to select a row including a memory cell to which signal writing is to be performed, a row selection pulse is applied to a row selection switch 305.

Next, in order to select the memory cell to which signal writing is to be performed, a memory selection pulse is applied to the memory selection switches (SW) to electrically connect the pixel outputs to one memory capacitor ($C_{AM}$). The pixel output signal voltage is written in the memory capacitor ($C_{AM}$). After that, the memory selection switches (SW) are turned off to hold the signal voltages written in the memory capacitors ($C_{AM}$).

When an intra-pixel correlated double sampling selection switch (CDS) 108 is ON, the number of signals output from one pixel in one frame is one, and when the intra-pixel correlated double sampling selection switch (CDS) 108 is OFF, the number of signals output from one pixel in one frame is two or more, and writing and holding operations of these signals are performed by switching the memory selection switch (SW) 306 and the row selection switch (WS) 305 and thereby switching the memory capacitor ($C_{AM}$) electrically connected to the pixel output for each pixel output signal.

The pixel output signal is written and held in the memory cells of the analog memory array 301 by the above-described reading operation.

When the imaging frame period ends and a signal held in each memory cell is read out, the memory readout circuit 302 is driven to sequentially scan the memory cells and read out a voltage signal held in each memory cell. Specifically, first, a row selection pulse is applied to a corresponding row selection switch in order to select a row in which a memory cell to be read out is present. The signal wiring is then reset to a specified voltage and then the signal wiring is made to be floating state. Next, a memory selection pulse is applied to the corresponding memory selection switch to 108 electrically connect the corresponding pixel signal holding capacitor ($C_{AM}$) 309 and the corresponding signal wiring. At this time, capacitance division of electric charges accumulated in the capacitance of the corresponding signal wiring and the corresponding capacitance ($C_{AM}$) 309 occurs, and a signal voltage corresponding to the voltage held in the memory capacitor CAM is generated in the signal wiring.

The memory readout circuit 302 amplifies the signal voltage and reads out the signal of the analog memory array 301.

FIG. 4 is a timing chart showing an example of the timing of the pixel drive of the optical sensor of the present invention and time transition of the floating diffusion voltage (VFD).

The pulse waveform indicated by the frame period (ΦFrame) is a pulse indicating the frame period, and the numbers correspond to the frame numbers.

The pulse waveform represented by the reset pulse (ΦR) indicates ON/OFF of the reset pulse (ΦR) transmitted to the reset transistor (R) 104.

The pulse waveforms indicated by the first voltage signal read pulse (ΦSig1) and the second voltage signal read pulse (ΦSig2) indicate the timings related to the signal readout of the first voltage signal (1) and the second voltage signal (2), respectively.

The waveform represented by the floating diffusion voltage (VFD) indicates the time transition of the potential in the floating diffusion section.

In the case of bypassing the intra-pixel correlated double sampling circuit 101b, the falling times (t2, t3) of the first voltage signal read pulse (ΦSig1) and the second voltage signal read pulse (ΦSig2) indicate the timings to start holding the first voltage signal (A1) and the second voltage signal (A2), respectively, in different pixel signal holding capacitances ($C_{AM}$).

When the intra-pixel correlated double sampling circuit 101b is used, the falling time (t2) of the first voltage signal read pulse (ΦSig1) indicates the timing at which the intra-pixel correlated double sampling sample hold capacitance ($C_{SH}$) 111 is reset to the intra-pixel correlated double sampling circuit reset voltage (VR_CDS).

The falling time (t3) of the second voltage signal read pulse (ΦSig2) indicates the timing at which the pixel signal holding capacitor ($C_{AM}$) starts to hold the voltage signal (B) based on the voltage signal (A) whose reset noise voltage signal (VN) has been canceled by subtracting the first voltage signal (1) from the second voltage signal (2).

Note that light is irradiated during the frame period (ΦFrame).

As shown in FIG. 4, both in the cases of bypassing and using the intra-pixel correlated double sampling circuit 101b, the reset pulse (ΦR) rises at the start of the frame period (ΦFrame), and the photodiode (PD) 102 and the capacitance ($C_{FD}$) of the floating diffusion (CFD) 103 are reset to a predetermined reset voltage (VR_FD). Time t1 indicates a time at which the reset pulse (ΦR) falls, the resetting operation is completed, and the reset noise voltage (VN) is taken into the floating diffusion voltage (VFD). After the resetting operation is completed, photoelectric charge corresponding to the amount of irradiated light is accumulated in the floating diffusion capacitor ($C_{FD}$), and the floating diffusion voltage (VFD) changes over time. Time t2 indicates a time after a predetermined period (t2−t1) has elapsed from time t1, at which the first voltage signal read pulse (ΦSig1) falls, and there occurs readout of a first voltage signal (A1) that is based on the reset noise voltage (VN) and the voltage signal (Vsig1) generated by the photoelectric charge accumulated in the floating diffusion capacitor ($C^{FD}$) during and the predetermined period (t2−t1).

Time t3 indicates a time after a predetermined accumulation period (t3−t2) has elapsed from time t2, at which ΦSig2 falls and there occurs readout of a second voltage signal (A2) that is based on the reset noise voltage (VN) and the signal voltage (Vsig2) generated by the photoelectric charge accumulated in the floating diffusion during the predetermined period (t3–t1). Here, in order to increase the frame rate, the accumulation time (t3–t2) is preferably set to be 1 μsec or less.

By subtracting the first voltage signal (A1) from the second voltage signal (A2) read in this way in the circuit of the subsequent stage, the reset noise voltage (VN) to be taken into the floating diffusion (CFD) when the reset operation is completed is canceled, and the voltage (Vsig2–Vsig1) generated by the photoelectric charge accumulated in the capacitance ($C_{FD}$) of the floating diffusion (CFD) during the predetermined storage period (t3–t2) can be accurately obtained.

Next, driving of the optical sensor of the present invention will be described with reference to FIGS. 1 to 4.
(1) A Case of Bypassing the Intra-Pixel Correlated Double Sampling Circuit 101b First, description will be made to a case where a signal (ΦCDSb) is applied to the terminal 126 so that the intra-pixel correlated double sampling bypass switch (CDSb) 109 is in ON state and the intra-pixel correlated double sampling selection switch (CDS) 108 is in OFF state. Incidentally, light is irradiated during the frame period.

A reset pulse (ΦR) for pixel resetting is applied to the terminal 123 of the reset transistor (R) 104, and the light-receiving element (PD) 102 and the floating diffusion (CFD) 103 constituting the pixel in the optical sensor pixel circuit 101a are reset.

At the completion of resetting (t1) at which the reset transistor (R) 104 is in the OFF state, a reset noise voltage signal (VN) is induced in the floating diffusion (CFD) 103.

Next, after a predetermined period (t2–t1) has elapsed from t1, a first voltage signal (A1) is read out from the optical sensor pixel circuit 101a in the following manner.

The first voltage signal (A1) to be read out to the pixel output signal line (PIXEL_OUT) 117 after completion of resetting is based on a voltage signal (A1–A) consisting of the reset noise voltage signal (VN) and a first photoelectric charge voltage signal (VsigA1) due to photoelectric charges collected by the light-receiving element (PD) 102 during a predetermined period (t2–t1) from the completion of resetting to the reading of the first voltage signal (A1) and transported to the floating diffusion (CFD) 103.

First, when a pixel selection first pulse (ΦX1) is applied to a terminal 124 of a first selection transistor (X1) 106, a first source follower transistor (SF1) 105 is activated, and a first voltage signal (A1) corresponding to the voltage signal (A1–A) is output to the pixel output signal line (PIXEL_OUT) 117. At the same time, one of four memory column selection switches 305 (WS1 to WS4) is turned ON to select the corresponding memory column, pulse signals of a predetermined combination are applied to the pulse signal lines (311 to 320) for signal holding memory cell selection, and thereby the pixel output signal line (PIXEL_OUT) 117 is electrically coupled with the pixel signal holding capacity ($C_{AM}$) 307 in one memory cell 307a.

Specifically, for example, a combination of pulses is transmitted to the pulse signal lines (311 to 320) for signal holding memory selection, and only the pulse signal line 310-1 and the pulse signal line 311-1 are set to the High level, and the other pulse signal lines are set to the Low level.

Under this situation, corresponding one (WS1) of four memory column selection switches 305 (WS1 to WS4) and corresponding one (SW1) of four selection switches 306 (SW1 to SW4) for pixel signal holding memory selection, are turned ON to select a memory cell 307a in the pixel signal holding memory array 303 via the pixel signal transfer signal line 313-1. As a result, a first voltage signal (A1) corresponding to the voltage signal (A1–A) is transferred to the pixel signal holding capacitor ($C_{AM}$) 307 of one memory cell 307a via the pixel output signal line 117 and the pixel signal transfer signal line 313-1.

Next, by changing the pulse state transmitted to the pulse signal line 311-1 for selecting the signal holding memory, the pulse signal line 311-1 for selecting the signal holding memory is set to Low level, and the selection switch (SW1) 306 for selecting the corresponding pixel signal holding memory is turned off, so that the first voltage signal (A1) is held in the pixel signal holding capacitor ($C_{AM}$) 307 until the first voltage signal (A1) is read out by driving the memory readout circuit 302.

Next, an accumulation period (t3–t2) is provided.

Photoelectric charges generated during the accumulation period (t3–t2) is drift-transported to the floating diffusion (CFD) 103 by the potential gradient of the light-receiving element (PD) 102 shown in the potential section 201 shown in FIG. 2, is accumulated in the capacitance ($C_{FD}$) of the floating diffusion (CFD) 103.

During the accumulation period (t3–t2), by turning OFF the first selection transistor (X1) 106, it is possible to suppress the power consumed by the first source follower transistor (SF1) 105. However, when the storage period (t3–t2) is as short as several nsec or less, the ratio of the time to drive the first source follower (SF1) 105 during the storage period (t3–t2) becomes large, and the effect of low power dissipation obtained by turning off the first selection transistor (X1) 106 becomes relatively small. In such a case, since omitting the time required to switch ON/OFF the state of the first selection transistor (X1) 106 contributes to obtain a higher imaging speed, the first selection transistor (X1) 106 may rather be left in the ON state during the accumulation period (t3–t2).

Next, after the accumulation period (t3–t2) ends, a second voltage signal (A2) is read out.

The second voltage signal (A2) is based on a voltage signal (A2–A) consisting of a reset noise voltage signal (VN) and a second photoelectric charge voltage signal (VsigA2) due to photoelectric charge collected by the light-receiving element (PD) 102 and transported to the floating diffusion (CFD) 103 from the completion of resetting to the readout of the second voltage signal (A2).

First, when the first selection transistor (X1) 106 is in the OFF state, the first pixel selection pulse (ΦX1) is applied to the terminal 124 to activate the first source follower transistor (SF1) 105, and the second voltage signal (A2) corresponding to the voltage signal (A2–A) is output to the pixel output signal line (PIXEL_OUT) 117. At the same time, one of four memory column selection switches 305 (WS1 to WS4) is turned on to select the corresponding memory column, and pulse signals of a predetermined combination are applied to the pulse signal lines (311 to 320) for selecting the signal holding memory, thereby electrically coupling the pixel output signal line (PIXEL_OUT) 117 with the pixel signal holding capacitor ($C_{AM}$) 309 of one memory cell, for example, the memory cell 309a.

Specifically, for example, a combination of pulses is transmitted to the pulse signal lines 310 to 320 for selecting the signal holding memory, and only the pulse signal line 310-1 and the pulse signal line 312-1 are set to the High level, and the others are set to the Low level. In so doing, a memory column selection switch (WS1) 305 and one of the selection switches 306 (SW1 to SW4) for selecting the pixel signal holding memory, for example, the selection switch 306 (SW1) is turned on and the memory cell 309a is selected via the signal line 313-1 for pixel signal transfer.

As a result, the second voltage signal (A2) corresponding to the voltage signal (A2-A) is held in the pixel signal holding capacitor ($C_{AM}$) 309 of one memory cell 309a via the pixel output signal line 117 and the signal line 313-1 for transferring the pixel signal.

Next, the pulse state to be transmitted to the pulse signal line 312-1 for selecting the signal holding memory is changed to set the pulse signal line 312-1 for selecting the signal holding memory to the Low level, the selection switch 308 for selecting the pixel signal holding memory is turned off, a signal is written into the pixel signal holding capacitor ($C_{AM}$) 309, and the second voltage signal (A2) is held for a period until the second voltage signal (A2) is read out by driving the memory readout circuit 302.

By subtracting the first voltage signal (A1) written in the memory cell 307a from the second voltage signal (A2) written in the memory cell 309a, a voltage signal (VsigA2-VsigA1) in which the reset noise voltage signal (VN) is canceled can be obtained.

In the present embodiment, the voltage signal (VsigA2-VsigA1) which is the difference between the signals is obtained by reading the first voltage signal (A1) and the second voltage signal (A2) to the outside of the chip in a manner to be described later, and then performing subtraction outside the chip.

The foregoing is an example in which signal readout are performed twice within one frame period, that are for the first voltage signal (A1) (pixel signal) corresponding to the voltage signal (A1-A) formed in the capacitor ($C_{FD}$) of the floating diffusion (CFD) 103 and the second voltage signal (A2) (pixel signal) corresponding to the voltage signal (A2-A) formed in the capacitor ($C_{FD}$) in the same manner, but when the intra-pixel correlated double sampling circuit 101b is bypassed, the pixel signal can be read out three or more times in the same frame period (ΦFrame), as will be described later. When reading three or more times, similarly to the above, a predetermined combination of pulse signals is applied to the pulse signal line 310 for signal holding memory selection to select the corresponding memory cell at the time of each signal reading to write and hold the signal output.

After completion of one frame period, a reset pulse for pixel reset (ΦR) is input to the terminal 123 of the reset transistor (R) 104, and the next frame period begins.

The above-described series of operations is repeated, and image capturing is performed for a plurality of frame periods, and signal writing is performed to all the memory cells of the analog memory array 301.

After signal writing is performed to all the memory cells, the address of memory cell selection is returned to the start address and overwriting operation may be repeated until a trigger signal for stopping image-capturing is input from the camera.

After the image-capturing operation is completed, signals written in the memory cell are read out by a method described later.

(2) A case of using the intra-pixel correlated double sampling circuit 101b

Next, a case will be described in which the intra-pixel correlated double sampling selection switch (CDS) 108 is in the ON state, and the intra-pixel correlated double sampling bypass switch (CDSb) 109 is in the OFF state.

First, a reset pulse (ΦR) for pixel reset is applied to the terminal 123 of the reset transistor (R) 104, and the light-receiving element (PD) 102 constituting the pixel in the optical sensor pixel circuit 101a and the floating diffusion (CFD) 103 are reset. At a completion of resetting (t1) at which the reset transistor (R) 104 is turned off, a reset noise voltage signal (VN) is generated in the floating diffusion (CFD) 103.

Next, after a predetermined period (t2−t1) has elapsed from t1, the first voltage signal (B1) is read out from the optical sensor pixel circuit 101a to the intra-pixel correlated double sampling circuit 101b as follows.

The first voltage signal (B1) read out from the optical sensor pixel circuit 101a to the intra-pixel correlated double sampling circuit 101b after the resetting is completed is based on a voltage signal (B1-A) composed of a reset noise voltage signal (VN) taken in the floating diffusion (CFD) 103 after completion of resetting and a first photoelectric charge voltage signal (VsigB1) produced by photoelectric charges collected by the light-receiving device (PD) 102 and transported to the floating diffusion (CFD) 103 during a predetermined period (t2−t1) from the reset to the readout of the first voltage signal (B1).

First, when a first pulse for pixel selection (ΦX1) is applied to the terminal 124 of the first selection transistor 106, a first source follower transistor (SF1) 105 is activated, a first voltage signal (B1) based on a voltage signal (B1-A) is generated at the electrode on the intra-pixel correlated double sampling bypass switch (CDS) 108 side of the intra-pixel correlated double sampling coupling capacitance ($C_C$) 110. At the same time, the intra-pixel correlated double sampling preset pulse (ΦNS) is applied to the terminal 128 to turn on and off the intra-pixel correlated double sampling reset switch (NS) 112, and the opposing electrode side of the intra-pixel correlated double sampling coupling capacitance ($C_C$) 110, that is, the intra-pixel correlated double sampling sample hold capacitance ($C_{SH}$) 111 is reset to the intra-pixel correlated double sampling circuit reset voltage (VR_CDS).

Next, an accumulation period (t3−t2) is provided.

Photoelectric charge generated during the accumulation period (t3−t2) is drift-transported to the floating diffusion (CFD) 103 by a potential gradient of the potential section 201 of the light-receiving device (PD) 102 and is accumulated in the capacitance ($C_{FD}$) of the floating diffusion (CFD) 103.

During the accumulation period (t3−t2), by turning off the first selection transistor (X1) 106, it is possible to suppress the power consumed by the first source follower transistor (SF1) 105.

On the other hand, when the accumulation period (t3−t2) is as short as several nsec, the first selection transistor (X1) 106 may be kept on during the accumulation period (t3−t2) for the above-described reason.

After the accumulation period (t3−t2) ends, the second voltage signal (B2) is read out from the optical sensor pixel circuit 101a to the intra-pixel correlated double sampling circuit 101b in the following manner.

The second voltage signal (B2) is formed based on a voltage signal (B2-A) consisting of the reset noise voltage signal (VN) and a second photoelectric charge voltage signal (VsigB2) collected by the light-receiving element (PD) 102 and transported to the floating diffusion (CFD) 103 from the completion of the resetting to the readout of the second voltage signal (B2).

First, when a first selection transistor (X1) 106 is in OFF state, a pixel selection first pulse (ΦX1) is applied to the terminal 124 and the first source follower transistor (SF1) 105 becomes active state, and a second voltage signal (B2) corresponding to the second photoelectric charge-voltage signal (VsigB2) is generated at the electrode on the intra-pixel correlated double sampling bypass switch (CDS) 108 side of the intra-pixel correlated double sampling coupling capacitance ($C_C$) 110. At this time, the voltage of the intra-pixel correlated double sampling sample hold capacitor ($C_{SH}$) 111 capacitively coupled to the intra-pixel correlated double sampling coupling capacitance ($C_C$) 110 varies by the product of the voltage change (VsigB2−VsigB1) of the second voltage signal (B2) from the first voltage signal (B1) and $C_C/(C_C+C_{SH})$ with reference to the intra-pixel correlated double sampling circuit reset voltage (VR_CDS).

As described above, by subtracting the first voltage signal (B1) from the second voltage signal (B2), a voltage signal (BA) from which the reset noise voltage signal (VN) is canceled is obtained.

Next, a pixel selection second pulse (ΦX2) is applied to the terminal 127 to turn on the second selection transistor (X2) 114, and a pixel selection second 2A pulse (ΦX2') is applied to the terminal 127a (X2') to turn ON the second selection transistor (X2') 115, respectively, and a voltage signal (BB) corresponding to the voltage signal (BA) is output to pixel output signal line 117.

At the same time, one of four memory column selection switches (WS1 to WS4) in the memory column selection switch array 301a is turned ON to select a corresponding memory column, and pulse signals of predetermined combinations are applied to the pulse signal lines (311 to 320) for selecting the signal holding memory, thereby electrically coupling the pixel output signal line 117 with the pixel signal holding capacitor ($C_{AM}$) 307 of one memory cell, for example, the memory cell 307a.

As a specific example, by applying a pulse signal of a combination of pulses to the pulse signal lines 310 to 320 for signal holding memory selection to set only the pulse signal line 310-1 and the pulse signal line 311-1 to High level and the others to the Low level, the memory column selection switch (WS1) 305 and the selection switch (SW1) 306 for selecting the pixel signal holding memory are turned ON, the memory cell 307a in the pixel signal holding memory array 303 is selected via the signal line 313-1 for transferring the pixel signal, and the voltage signal (BB) is induced in the pixel signal holding capacitor ($C_{AM}$) 307.

Next, the pulse state transmitted to the pulse signal line 311-1 for signal holding memory selection is changed to set the pulse signal line 311-1 for selecting the signal holding memory to Low level, and the selection switch (SW1) 306 for selecting the pixel signal holding memory selection is turned OFF, so that the voltage signal (BB) is held in the pixel signal holding capacitance ($C_{AM}$) 307. The voltage signal (BB) is held in the pixel signal holding capacitor ($C_{AM}$) 307 until the memory readout circuit 302 is driven to read out the voltage signal (BB).

After the corresponding frame period is completed as described above, a reset pulse for pixel reset (ΦR) is input to the terminal 123 of the reset transistor (R) 104, and the next frame period begins.

The series of operations described above are repeated to perform image capturing for a plurality of frame periods (ΦFrame). Signal writing is performed to all the memory cells in the analog memory array 301.

Further, after signal writing is performed to all the memory cells, the address of memory cell selection is returned to the start address and overwriting operation may be repeated until a trigger signal for stopping image-capturing is input from the camera.

After the image capturing operation is completed, the signal written in each memory cell is read out by a method to be described later.

(3) In a Case where Pixel Signal is Read Four Times in a Frame Period by Bypassing the Intra-Pixel Correlated Double Sampling Circuit 101b

FIG. 5 shows a timing chart in the case of reading the pixel signal four times in the same frame period (ΦFrame).

Here, t1 indicates a time at which resetting is completed, t2 indicates a time after a predetermined period (t2−t1) has elapsed from t1, at which the first voltage signal is read out from the optical sensor pixel circuit 101a, t3, t4, and t5 indicate times at which the second voltage signal, the third voltage signal, and the fourth voltage signal are read out from the optical sensor pixel circuit 101a, and the storage periods T1, T2, and T3 indicate the storage periods (t3−t2), (t4−t3), and (t5−t4), respectively.

A case where a signal (ΦCDSb) is applied to the terminal 126 to make an intra-pixel correlated double sampling bypass switch (CDSb) 109 in ON state, and the intra-pixel correlated double sampling selection switch (CDS) 108 is in OFF state will be described. Light is being irradiated during the frame period. A reset pulse (ΦR) for pixel reset is applied to the terminal 123 of the reset transistor (R) 104, and the light-receiving element (PD) 102 constituting the pixel in the optical sensor pixel circuit 101a and the floating diffusion (CFD) 103 are reset.

At a completion of resetting (t1) at which the reset transistor (R) 104 is turned OFF, a reset noise voltage signal (VN) is induced in the floating diffusion (CFD) 103.

Next, after a predetermined period (t2−t1) has elapsed from t1, a first voltage signal (C1) is read out from the optical sensor pixel circuit 101a in the following manner. The first voltage signal (C1) to be read out on the reading pixel output signal line (PIXEL_OUT) 117 after completion of resetting is based on a voltage signal (C1−A) consisting of the reset noise voltage signal (VN) and a first photoelectric charge voltage signal (VsigC1) produced by photoelectric charges collected by the light-receiving element (PD) 102 in a predetermined period (t2−t1) from the completion of resetting to the readout of the first voltage signal (C1) and transported to the floating diffusion (CFD) 103.

First, when a pixel selection first pulse (ΦX1) is applied to the terminal 124 of the first selection transistor (X1) 106, the first source follower transistor (SF1) 105 is activated, the first voltage signal (C1) corresponding to the voltage signal (C1−A) is output to the pixel output signal line (PIXEL_OUT) 117. At the same time, one of the four memory column selection switches 305 (WS1 to WS4) is turned ON to select the corresponding memory column, pulse signals of a predetermined combination are applied to the pulse signal lines for signal holding memory cell selection (311 to 320), so that a pixel signal holding capacitance ($C_{AM}$) 307 in the pixel output signal line (PIXEL_OUT) 117 and one memory cell 307a are electrically coupled, and a first voltage signal (C1) corresponding to the voltage signal (C1−A) is transferred to the pixel signal holding capacitance ($C_{AM}$) 307 and held for a period until it is read out by the driving the memory readout circuit 302.

Next, an accumulation period 1 (t3−t2) is provided. Photoelectric charges generated during the accumulation period 1 (t3−t2) are drift-transported to the floating diffusion (CFD) 103 by the potential gradient in the potential section 201 of the light-receiving element (PD) 102 shown in FIG. 2, and accumulated in the capacitance ($C_{FD}$) of the floating diffusion (CFD) 103.

Next, after the accumulation period 1 (t3−t2) ends, the second voltage signal (C2) is read out. The second voltage signal (C2) is based on a voltage signal (C2−A) consisting of a reset noise voltage signal (VN) and a second photoelectric charge voltage signal (VsigC2) due to photoelectric charge collected by the light-receiving element (PD) 102 from the completion of resetting to readout of the second voltage signal (C2) and transported to the floating diffusion (CFD) 103.

First, when the first selection transistor (X1) 106 is in OFF state, a pixel selection first pulse (ΦX1) is applied to the terminal 124, and the first source follower transistor (SF1) 105 is activated, and the second voltage signal (C2) corresponding to the voltage signal (C2–A) is output to the pixel output signal line (PIXEL_OUT) 117.

At the same time, one of the four memory column selection switches 305 (WS1 to WS4) is turned ON to select the corresponding memory column, and pulse signals of a predetermined combination are applied to the pulse signal lines for selecting the signal holding memory (311 to 320), whereby the pixel output signal line (PIXEL_OUT) 117 and the pixel signal holding capacitor ($C_{AM}$) 309 of one memory cell, for example, the memory cell 309a are electrically coupled to each other, and the first voltage signal (C2) corresponding to the voltage signal (C2–A) is transferred to the pixel signal holding capacitor ($C_{AM}$) 307, and held for a period until the first voltage signal (C2) is read out by driving of the memory readout circuit 302.

Next, in the same manner as the readout of the second voltage signal (C2), a third voltage signal (C3) is read out after the end of the accumulation period 2 (t4–t3), and a fourth voltage signal (C4) is read out after the end of the accumulation period 3 (t5–t4).

By subtracting the first voltage signal (C1) written in one of the memory cells from the second voltage signal (C2) written in another memory cell, a signal based on the photoelectric charge accumulated in the capacitor ($C_{FD}$) of the floating diffusion (CFD) 103 during the accumulation period 1 in which the reset noise voltage signal (VN) is canceled is obtained. Similarly, by subtracting the second voltage signal (C2) from the third voltage signal (C3), a signal based on the photoelectric charge accumulated in the capacitance ($C_{FD}$) of the floating diffusion (CFD) 103 in the period of the accumulation period 2 is obtained, and by subtracting the third voltage signal (C3) from the fourth voltage signal (C4), a signal based on the photoelectric charge accumulated in the capacitance ($C_{FD}$) of the floating diffusion (CFD) 103 during the accumulation 3 is obtained.

Further, the method of processing the second to fourth voltage signals is not limited to the above, signals based on the photoelectric charge accumulated in the capacitance (CFD) of the floating diffusion (CFD) 103 acquired during the period of substantially the accumulation period 2-1 (t5–t3) and the accumulation period 2-2 (t4–t2) may be obtained by subtracting the second voltage signal (C2) from the fourth voltage signal (C4) and subtracting the first voltage signal (C1) from the third voltage signal (C3). Further, by subtracting the first voltage signal (C1) from sum-average of the second to fourth voltage signals, may be used for reading with reduced random noise superimposed at the time of signal reading. In addition, the timing of t1 to t5 may be synchronized with the modulated light irradiation and applied to distance imaging or fluorescence lifetime imaging of the light time-of-flight type.

In this embodiment, signals based on the photoelectric charges accumulated in the capacitors ($C_{FD}$) of the floating diffusions (CFDs) 103 can be obtained in the accumulation periods 1, 2, and 3 that are shorter divisions of one frame period, so that a higher time resolution can be obtained. In this embodiment, an example in which the pixel signal is read four times within one frame period is described, however, the present invention is not limited to four times. The maximum number of pixel signals that can be read out within one frame period is equal to the number of memory cells included in the analog memory array 301 and is 80 times in this embodiment.

As is apparent from the above description of the operation, when bypassing the intra-pixel correlated double sampling circuit 101b, the pulse operation during the frame period (ΦFrame) is minimized, and it is suitable for high-speed operation. Furthermore, when the pixel signal is read out three or more times in one frame period, the frame period can be further divided, which is preferable to obtain a higher time resolution.

On the other hand, when using the intra-pixel correlated double sampling circuit 101b, the frame period (ΦFrame) is extended by the time required for driving the intra-pixel correlated double sampling circuit 101b, but since it is possible to make the number of memory cells used in one frame to be one, it is possible to maximize the number of continuous recorded frames even when using a memory array having a limited number.

Thus, compared with the conventional example, the present invention has an advantage in that the operation mode can be switched according to the priority of the frame rate and the number of recording frames.

The choice of using or not using (but bypassing) the intra-pixel correlated double sampling circuit 101b may be arbitrary, but in order to maximize the advantage of the present invention, it is preferable to selectively use or non-use of the circuit 101b on the basis of the following criteria.

Intra-pixel correlated double sampling circuit 101b is preferably used when it is desired to prioritize the number of continuous recording frames, since it is possible to maximize the effect.

As the cases of desirably prioritize the number of continuous recording frames, specifically, cases of image-capturing combustion injection or spark discharge of automobile engines, ink discharge of an ink jet printers, or the like, which are phenomena that occur continuously for a relatively long time, may be exemplified.

Further, when an object is image-captured for the first time and synchronization of the image-capturing timing is required, it is advantageous to adjust the trigger timing by using a mode (A) which uses this intra-pixel correlated double sampling circuit 101b, since the work for synchronizing can be easily performed. On the other hand, it is preferable to use a mode (B) which bypasses the circuit 101b when the image-capturing speed is to be prioritized, because the mode can maximize its effect.

The use of this mode (B) is specifically suitable for image-capturing of high-speed phenomena such as fracture phenomena a of materials, laser ablation discharge phenomena.

Further, in the present invention, it is also possible to switch from the case of using the circuit 101b ("mode (A)") to the case of bypassing ("mode (B)") for each frame.

For example, since it is possible to further increase the number of recording frames by using the circuit 101b, it is possible to operate in mode (A) and switch the mode to mode (B) to perform image-capturing at a high-speed from the moment when the high-speed phenomenon of the object to be image-captured occurs.

As a specific example, when image-capturing a phenomenon in which a resin bullet collides with a target at a high speed and destroyed, image-capturing is performed in mode (A) until just before the resin bullet collides with the target, and the mode is switched to mode (B) just before the resin bullet collides with the target so that the fracture phenomenon caused by the collision is image-captured at a higher speed.

In this case, in the analog memory array 301, since the capacitances ($C_{AM}$) A holding signals that have bypassed the circuit 101b and in which noise have not been cancelled and the capacitances ($C_{AM}$) B holding signals that have passed the circuit 101b and in which noise is canceled are present in mixture, it is necessary to take the following technical care when visualizing the held signal.

That is, the frame serial number immediately before the mode switching is recorded, and after reading all the signals held in the analog memory array 301, signals before the mode switching is visualized as noise-canceled signals, and signals after the mode switching are visualized after noise cancellation by subtracting the first voltage signal (A1) for noise cancelation from the second voltage signal (A2) recorded for each frame.

In the example shown in FIG. 3, the number of memory cells included in the analog memory array 301 is 80, but the number of memory cells is not limited to this, and the number is determined according to the design. Since the number of memory cells is limited by the area of the analog memory array 301 and is a design element for determining the aperture ratio and the pixel size. Therefore, the number of memory cells is determined by the balance between the aperture ratio and the pixel size according to the performance required for the optical sensor.

In the present invention, it is preferable that the number of memory cells is 10 or more, but in order to increase the number of recording frames, it is preferable that the number of memory cells is 40 or more, and more preferably 128 or more. Further, in order to increase the number of recording frames, it is desirable to set the number to 256 or more.

In order to further reduce the surface area of the optical sensor chip, it is preferable to employ a multilayer structure in which the analog memory circuit unit 300 is provided in the lower layer of the optical sensor pixel circuit unit 100.

FIG. 6 is a block diagram of an image sensor according to the present invention.

The image sensor 600 illustrated in FIG. 6 includes a light-receiving signal generating and holding element array 602 in which a plurality of light-receiving signal generating and holding elements 601 are two-dimensionally arranged, a memory selection circuit 603, a pixel drive pulse buffer train circuit 604, and a column selecting circuit 605.

On the downstream side of the pixel drive pulse buffer train circuit 604, an output buffer 606 and a signal output terminal 607 are provided along a signal transmission path.

A receiving signal generating and holding element 601 is composed of an optical sensor pixel circuit unit 100 and an analog memory circuit unit 300.

A drive for reading out signals from the analog memory array 301 of the image sensor 600 of the present invention will be described with reference to FIGS. 3 and 6.

First, when a trigger signal of the completion of image-capturing is input to the image sensor 600, an image-capturing period of the image sensor 600 ends, and then the process proceeds to a signal output period of the image sensor 600.

In the signal output period in the image sensor 600, signal readout is performed for each analog memory array 301 corresponding to pixels of each row. That is, the memory selection circuit 603 is driven to select a memory readout circuit 302 for one pixel row, and an output signal line 302a of the memory readout circuit 302 and the vertical signal line 608 are coupled to each other.

Next, a row in the analog memory 301 including a memory cell to be read is then selected. For example, among 310-1 to 4, only 310-1 is put in a High level to selectively turn ON the memory row selection switch WS1 to couple the signal line 313-1 for pixel signal transfer with the memory readout circuit 302.

Next, after resetting the signal line 313-1 for pixel signal transfer to a predetermined voltage (5A), the signal line for pixel signal transfer 313-1 for pixel signal transfer is placed in a floating state. Next, one of the memory cells is selected and the corresponding pixel signal holding capacitor ($C_{AM}$) is coupled with the corresponding pixel signal transferring signal line 313-1. At this time, a voltage signal (5S-1) written in the corresponding pixel signal holding capacitor ($C_{AM}$) is capacitance-divided into the corresponding pixel signal holding capacitor ($C_{AM}$) and a capacitance parasitic on the corresponding pixel signal transferring signal line 313-1, and is input to the memory readout circuit 302. The memory readout circuit 302 outputs a voltage signal (5S-2) based on the voltage signal (5S-1) to the vertical signal line 608. At this time the voltage signal (5S-2) of the vertical signal line 608 is temporarily held in the train circuit 604. Then, by sequentially driving the column selecting circuit 605, the voltage signals held in the train circuit 604 (5S-1) are sequentially output to the signal output terminal 607 via the output buffer 606.

Similarly, signals of all memory cells selected by the memory column selection switch (WS1) 305 are read out by repeating resetting the signal line 313-1 for transferring the pixel signal, performing capacitance division of the voltage signal by the selection of the memory cell to be read next, driving the memory readout circuit 302, driving the column circuit 504, and performing chip output.

Similarly, other columns in the analog memory 301 are sequentially selected, the signals of all the memory cells in each column are read out, and thereby the signals of all the memory cells in the selected analog memory 301 are read out of the chip.

Next, the memory selection circuit 603 is driven to select a memory cell corresponding to a pixel column to be read next, and the same operation is repeated. This signal readout operation is performed for the memory cells of all the pixel columns.

By the above operation, signals of memories cell for all pixels are read out.

The present invention will be properly understood in the foregoing description, and the main advantages thereof will be summarized as follows.

(1) The transfer period and the settling time of the pixel drive pulse required to turn on and off the transfer gate, which was required in the prior art, becomes unnecessary.

(2) The frame rate is restricted only by the electric charge collection and transportation times in the light-receiving element, and it is possible to speed up the frame rate as high as 125 Mfps.

(3) Since the configuration is such that the signals are read out to memories connected at the shortest distances in the pixel, it is possible to reduce the circuit driving current required for pixel readout. Further, since the number of pixel-driving pulses is small, it is possible to reduce the power consumption relating to the pixel driving pulse. Therefore, it is possible to provide an optical sensor product with low power consumption to the market.

(4) With fewer pixel drive pulse types, pixel drive pulse circuits can be arranged within a pixel or within a pixel block without sacrificing an area.

(5) Since a small fully depleted type light-receiving element having a small capacitance density and a floating diffusion is coupled, increase in floating diffusion capacitance inversely proportional to the electric charge-voltage conversion gain is minimized, a high charge-voltage conversion gain is obtained, a reset noise of the floating diffusion can be canceled, and accordingly, high-sensitivity signal readout can be performed with low readout noise.

(5) By reading out the signal N times after resetting the light-receiving element and the floating diffusion, a higher frame rate can be obtained until the floating diffusion is saturated.

(6) By performing the signal reading synchronized with the modulated light-irradiation, it can be applied to range imaging and fluorescence lifetime imaging of the optical time-of-flight type.

Although the above is a part of the superiority of the present invention, from these superiorities, the present invention can be developed into various products. Examples are described below.

Since high-speed phenomena can be visualized,
Observation of material fracture phenomena: Analysis of fracture process and improvement of materials
Observation of microbubbles
Observation of discharge phenomena
Observation on cancer cell therapy.
Observation of ink jet
Observation of MEMS drive
Observation of shock waves
Observation of fuel spray into engine compartment
Laser beam machining
and the like may be applications,
which require video information of successive frames in a two-dimensional image, and a high-speed camera according to the present invention which is suitable for this demand is useful.

In addition, the present invention is also useful for high-time resolution cameras used in the field of distance imaging and bioimaging, which require imaging of distance and biological responses in two-dimensional images.

The present invention is not limited to the above embodiments, and various changes and modifications can be made without departing from the spirit and scope of the present invention. Accordingly, to make the scope of the invention public, the claims set forth in separate sheets are appended hereto.

REFERENCE SIGNS LIST

100 Optical sensor pixel circuit unit
101a Optical sensor pixel circuit
101b Intra-pixel correlated double sampling circuit (In-pixel CDS)
102 Light-receiving element (PD)
103 Floating Diffusion (CFD)
104 Reset transistor (R)
105 First source follower transistor (SF1)
106 First selection transistor (X1)
107 First current source transistor (CS1)
108 Intra-pixel correlated double sampling selection switch (CDS)
109 Intra-pixel correlated double sampling bypass switch (CDSb)
110 Intra-pixel correlated double sampling coupling capacitance (CC)
111 Intra-pixel correlated double sampling sample hold capacitance (CSH)
112 Intra-pixel correlated double sampling reset transistor (NS)
113 Second source follower transistor (SF2)
114 Second selection transistor (X2)
115 Second selection transistor (X2')
116 Second current source transistor CS2
117 Pixel output signal line (PIXEL_OUT)
118 Electrical terminal for applying pixel reset voltage (VR_FD)
119a, 119b Electrical terminal for applying power supply voltage (AVDD)
120 Electrical terminal for intra-pixel correlated double sampling circuit reset voltage (VR_CDS)
121 Electrical terminal for applying first current source bias voltage (VB1)
122 Electrical terminal for applying second current source bias voltage (VB2)
123 Electrical terminal for applying pixel reset pulse (ΦR)
124 Electrical terminal for applying pixel selection first pulse (ΦX1)
125 Electrical terminal for inputting intra-pixel correlated double sampling circuit select pulse (ΦCDS)
126 Electrical terminal for inputting intra-pixel correlated double sampling circuit bypass pulse (ΦCDSb)
127 Electrical terminal for inputting pixel selection second pulse (ΦX2)
128 Intra-pixel correlated double sampling reset pulse (ΦNS)
201 Potential section of fully depleted light-receiving element (PD) 102
202 Potential section of capacity ($C_{FD}$) of floating diffusion (CFD) 103
300 Analog memory circuit
301 Analog memory array (Analog Memories: $4^H \times 20^V$)
301a Memory cell row select switch array
302 Memory Readout Circuit
302a Output signal line
303,304 Pixel signal holding memory array
305 Memory cell row selection switch (WS1 to WS4) (1 to 4)
306 Pixel-signal holding memory selection switch (SW1 to SW4)
307 Pixel signal holding capacitor ($C_{AM}$)
307a Memory cell
308 Selection switch for selecting pixel signal holding memory
309 Pixel signal holding capacitor
310 Pulse signal line for selecting signal holding memory cell row (1 to 4)
311,312~320 Pulse signal line for signal holding memory cell selection (1 to 4)
313 Signal line for pixel signal transfer (1 to 4)
600 Image sensor
601 Light-receiving signal generation and holding element
602 Light-receiving signal generation and holding element array
603 Memory selection circuit
604 Pixel-driven pulse buffer train circuit
605 Column selection circuit 606 Output buffer
607 Signal output terminal
608 Vertical signal line

The invention claimed is:

1. A signal readout method of an optical sensor, comprising:
performing light-receiving by a light-receiving element which has a semiconductor junction fully depleted and a potential curve of electrons having a negative slope toward a floating diffusion and connected to an uppermost position of an electronic potential well of the floating diffusion while keeping its negative slope state;
transferring electric charges generated in the light-receiving element in response to the light-receiving to the floating diffusion according to the potential curve, accumulating the electric charges in the floating diffusion and converting the accumulated electric charges to a voltage signal; and
performing read-out of the voltage signal at least three times during each frame period provided in a period of the light-receiving, without intervention of resetting an electric potential of the floating diffusion between the read-outs, obtaining differential signals between the voltage signals that were read-out, and thereby obtaining least two signals representing amounts of the electric charges accumulated in respective periods that do not overlap to each other.

2. The signal readout method of an optical sensor according to claim 1, wherein an accumulation period in the accumulating of the electrons is 1 µs or less.

3. An optical area sensor comprising:
an optical sensor pixel circuit; and
an analog memory circuit unit,
wherein
the optical sensor pixel circuit unit includes:
an optical sensor pixel circuit which has two output systems alternatively used on a time axis, a light-receiving element and a floating diffusion that has a first end electrically directly connected to the light-receiving element, has a second end connected to a signal read-out circuit, accumulates electric charges generated by light input to the light-receiving element and converts the electric charges to a voltage signal;
the light-receiving element having a semiconductor junction that is completely depleted and a potential curve of electrons that has a negative slope toward the floating diffusion and connected to an uppermost position of an electronic potential well of the floating diffusion while keeping its negative slope state; and
an intra-pixel correlated double sampling circuit which outputs a signal (ab1) produced by noise cancellation based on a first output (a1) and a second output (b1) based on an amount of light-electric charges generated in the light-receiving element by light-irradiation, which is output from a first of the two output systems; and
the analog memory circuit unit includes:
an analog memory array in which a plurality of memory cells holding one of the signal (ab1), the first output (a2) and the second output (b2) output from a second of the two output systems are arranged in rows and columns;
a memory cell row selection switch array for selecting any of the rows of the memory cells; and
a memory readout circuit for reading out a signal held in any of the memory cells,
wherein, when the first of the two output systems is selected, the optical area sensor outputs from the optical sensor pixel circuit unit the signal (ab1) once in each frame period, stores the signal (ab1) in a memory cell of the analog memory circuit unit, and reads out the signal (ab1), and
wherein, when the second of the two output systems is selected, the optical area sensor outputs from the optical sensor circuit unit the non-noise canceled signal at least three times in each frame period provided in a period of the light-receiving, without intervention of resetting an electric potential of the floating diffusion between the outputs, storing the output non-noise canceled signals in respective memory cells of the analog memory circuit unit, obtains differential signals between the stored non-noise cancelled signals, and thereby reads out at least two noise-cancelled signals representing amounts of the electric charges accumulated in respective periods that do not overlap to each other.

4. The optical area sensor according to claim 3, wherein a capacitance ($C_{PD}$) of the light-receiving element and a capacitance (CFD) of the floating diffusion have the following relationship:

$$0.0008 \leq (C_{PD})/(C_{FD}) \leq 0.8;$$

$$4.0 \times 10^{-18}\ F \leq (CPD) \leq 4.0 \times 10^{-16}\ F;\ \text{and}$$

$$5.0 \times 10^{-16}\ F \leq (CFD) \leq 5.0 \times 10^{-15}\ F.$$

5. The optical area sensor according to claim 3, wherein the optical sensor pixel circuit unit and the analog memory circuit unit are disposed adjacently to each other on a same planar.

6. The optical area sensor according to claim 3, wherein the optical sensor pixel circuit unit and the analog memory circuit unit are stacked adjacently to each other.

* * * * *